(12) United States Patent
Nakamura

(10) Patent No.: US 11,342,435 B2
(45) Date of Patent: May 24, 2022

(54) WIDE-GAP SEMICONDUCTOR DEVICE

(71) Applicant: SHINDENGEN ELECTRIC MANUFACTURING CO., LTD., Tokyo (JP)

(72) Inventor: Shunichi Nakamura, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 16/772,130

(22) PCT Filed: Dec. 14, 2017

(86) PCT No.: PCT/JP2017/044820
§ 371 (c)(1),
(2) Date: Jun. 11, 2020

(87) PCT Pub. No.: WO2019/116481
PCT Pub. Date: Jun. 20, 2019

(65) Prior Publication Data
US 2021/0074827 A1    Mar. 11, 2021

(51) Int. Cl.
*H01L 29/49* (2006.01)
*H01L 29/16* (2006.01)
*H01L 29/78* (2006.01)

(52) U.S. Cl.
CPC ...... *H01L 29/4983* (2013.01); *H01L 29/1608* (2013.01); *H01L 29/7816* (2013.01)

(58) Field of Classification Search
CPC ..... H01L 29/49; H01L 29/4983; H01L 29/16; H01L 29/1608; H01L 29/78; H01L 29/7802; H01L 29/7816

USPC ............................................................ 257/76
See application file for complete search history.

(56) References Cited

U.S. PATENT DOCUMENTS

| 2002/0175383 | A1* | 11/2002 | Kocon ............... H01L 29/7813 257/376 |
| 2004/0031971 | A1 | 2/2004 | Shimoida et al. |
| 2010/0075474 | A1 | 3/2010 | Kudou et al. |
| 2010/0193796 | A1 | 8/2010 | Nakano |
| 2012/0205669 | A1 | 8/2012 | Miura et al. |

(Continued)

FOREIGN PATENT DOCUMENTS

| EP | 1845561 A2 | 10/2007 |
| EP | 2927939 A1 | 7/2015 |

(Continued)

OTHER PUBLICATIONS

International Search Report in the international application No. PCT/JP2017/044820, dated Jan. 23, 2019.

(Continued)

*Primary Examiner* — Fazli Erdem
(74) *Attorney, Agent, or Firm* — Ladas & Parry, LLP

(57) ABSTRACT

A wide gap semiconductor device has: a drift layer 12 using a first conductivity type wide gap semiconductor material; a well region 20, being a second conductivity type and provided in the drift layer 12; a polysilicon layer 150 provided on the well region 20; an interlayer insulating film 65 provided on the polysilicon layer 150; a gate pad 120 provided on the interlayer insulating film 65; and a source pad 110 electrically connected to the polysilicon layer 150.

7 Claims, 5 Drawing Sheets

(56) References Cited

U.S. PATENT DOCUMENTS

2013/0313576 A1* 11/2013 Nakano ............. H01L 21/02178
257/77
2016/0043167 A1   2/2016  Nakano
2016/0225891 A1   8/2016  Hiyoshi et al.

FOREIGN PATENT DOCUMENTS

| | | |
|---|---|---|
| JP | 2003318413 A | 11/2003 |
| JP | 2010109221 A | 5/2010 |
| JP | 2015056543 A | 3/2015 |
| JP | 2015211159 A | 11/2015 |
| JP | 2016058498 A | 4/2016 |
| WO | 2012001837 A1 | 2/2011 |

OTHER PUBLICATIONS

Notice of Allowance in Japanese Patent Application No. 2018-541241, dated Jun. 20, 2019 with English translation provided by Google Translate.

Office Action issued in Taiwanese Application No. 107145364, dated Jul. 29, 2019 with English translation provided by Google Translate.

Written Opinion of the International Search Authority in International Application No. PCT/JP2017/044820, dated Jan. 23, 2018 with English Translation provided by Google Translate.

Extended European Search Report from EP app. No. 17934558.2, dated Jun. 18, 2021.

Henning et al., "Electrical Characteristics of Rectifying Polycrystaline Silicon/Silicon Carbide Heterojunctions", Journal of Electronic Materials, vol. 27, No. 4, 1998, pp. 296-299.

Emori et al., "Novel Poly-Si/GaN Vertical Heterojunction Diode", Materials Science Forum, vols. 821-823, 2015, pp. 1015-1108.

* cited by examiner

WIDE-GAP SEMICONDUCTOR DEVICE

CROSS-REFERENCE TO RELATED APPLICATION

The present application is the U.S. national phase of PCT Application PCT/JP2017/044820 filed on Dec. 14, 2017, the disclosure of which is incorporated herein by reference in its entirety.

TECHNICAL FIELD

The present invention relates to a wide gap semiconductor device having a drift layer of a first conductivity type and a well region of a second conductivity type provided in the drift layer.

BACKGROUND ART

Typically, a well region of a second conductivity type such as a p type is provided in a region below a gate pad. However, in a MOSFET including a wide gap semiconductor such as SiC, a potential of the above-mentioned well region below the gate pad abnormally increases due to displacement current during a switching operation in some cases. In this regard, WO 2012/001837 A cites high sheet resistance of a well region of a second conductivity type below a gate pad as one of reasons for potential increase in the well region.

JP 2015-211159 A suggests provision of an n-type region in a p-type well region below a gate pad. However, in a case where this configuration is employed, there may possibly occur breakdown due to current concentration caused by parasitic bipolar operations.

Meanwhile, JP 2015-56543 A suggests provision of a Schottky electrode formed of a metallic material in a region below a gate pad. However, in a case where a Schottky electrode formed of a metallic material is used, the manufacturing method thereof is so complicated and incurs considerably high manufacturing costs.

SUMMARY OF INVENTION

Technical Problem

The present invention provides a semiconductor device that can prevent abnormal increase of a potential in a region below a gate pad.

Solution to Problem

[Concept 1]
A wide gap semiconductor device comprising:
a drift layer using a first conductivity type wide gap semiconductor material;
a well region, being a second conductivity type and provided in the drift layer;
a polysilicon layer provided on the well region;
an interlayer insulating film provided on the polysilicon layer;
a gate pad provided on the interlayer insulating film; and
a source pad electrically connected to the polysilicon layer.

[Concept 2]
The wide gap semiconductor device according to concept 1, wherein
the polysilicon layer and the well region are in Schottky contact.

[Concept 3]
The wide gap semiconductor device according to concept 1, wherein the polysilicon layer and the well region are in ohmic contact.

[Concept 4]
The wide gap semiconductor device according to any one of concepts 1 to 3, wherein
the polysilicon layer has a lightly-doped polysilicon layer provided on the well region, and a heavily-doped polysilicon layer, which is provided on the lightly-doped polysilicon layer and has an impurity concentration higher than an impurity concentration of the lightly-doped polysilicon layer.

[Concept 5]
The wide gap semiconductor device according to any one of concepts 1 to 3, wherein
the polysilicon layer has an undoped polysilicon layer provided on the well region, and a doped polysilicon layer provided on the undoped polysilicon layer.

[Concept 6]
The wide gap semiconductor device, according to any one of concepts 1 to 5, further comprising
a field insulating film provided between the well region and the polysilicon layer.

[Concept 7]
The wide gap semiconductor device, according to any one of concepts 1 to 6, further comprising
a gate electrode formed of polysilicon, which constitutes the polysilicon layer.

[Concept 8]
The wide gap semiconductor device according to any one of concepts 1 to 7, wherein
a source region is provided in the well region,
a region, which is adjacent to the source region and is electrically connected to the source pad, in the well region is a superhigh-concentration second conductivity type region.

Advantageous Effects of Invention

In the present invention, in a case of adopting an aspect in which the polysilicon layer electrically connected to the source pad is provided in a region below the gate pad and the polysilicon layer is in contact with the well region, abnormal increase of a potential in the well region in a region below the gate pad can be prevented. Further, it is possible to prevent current concentration that can be caused by parasitic bipolar operations in such a configuration as described in JP 2015-211159 A.

DESCRIPTION OF EMBODIMENTS

First Embodiment

<<Configuration>>

In the present embodiment, description will be given using a vertical MOSFET as one example. Though it is assumed that a first conductivity type is an n type and a second conductivity type is a p type in the description of the present embodiment, the present invention is not limited to that aspect. It may be set such that a first conductivity type is a p type and a second conductivity type is an n type. Further, though the description will be given using silicon carbide as a wide gap semiconductor in the present embodiment, the present invention is not limited to that aspect. Gallium nitride or the like may be used as a wide gap semiconductor. In the present embodiment, a vertical direction in FIG. 1 (a direction along a width of a wide gap semiconductor device) will be referred to as a vertical direction and a direction perpendicular to the vertical direction will be referred to as an in-plan direction.

Figure 1:
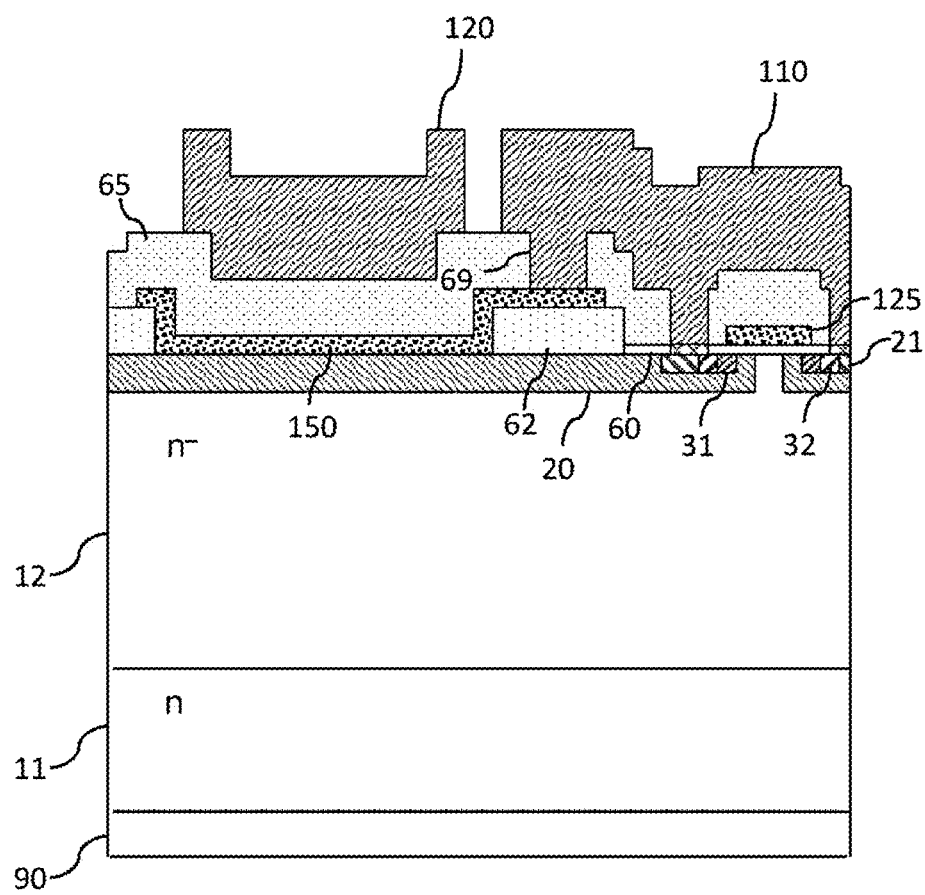
FIG. 1 is a sectional view of a semiconductor device that can be used in a first embodiment of the present invention.

As illustrated in FIG. 1, a silicon-carbide semiconductor device according to the present embodiment may have an n-type silicon-carbide semiconductor substrate 11, a drift layer 12 that is provided on a first main surface (upper surface) of the silicon-carbide semiconductor substrate 11 and uses an n-type silicon-carbide material, a plurality of well regions 20 of a p type provided in the drift layer 12, and n-type source regions 31 and 32 provided in the well regions 20. The well regions 20 may be formed by implantation of p-type impurities into the drift layer 12, for example, and the source regions 31 and 32 may be formed by implantation of n-type impurities into the well regions 20, for example. A drain electrode 90 may be provided on a second main surface (lower surface) of the silicon-carbide semiconductor substrate 11. A voltage withstanding structure may be provided outside an outer edge of a region to be used as a cell. As the drain electrode 90, titanium, aluminum, nickel, and the like may be used, for example.

Figure 2:
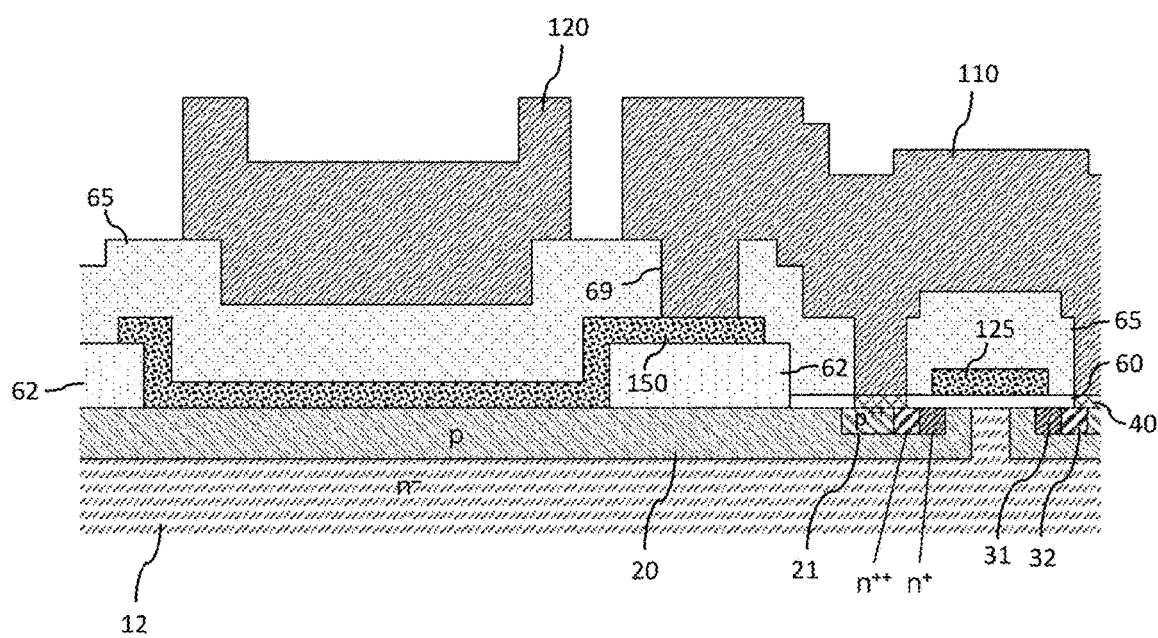
FIG. 2 is an enlarged sectional view of a part of FIG. 1.

As illustrated in FIG. 2, the silicon-carbide semiconductor device may have a polysilicon layer 150 provided on the well region 20, an interlayer insulating film 65 provided on the polysilicon layer 150, a gate pad 120 provided on the interlayer insulating film 65, and a source pad 110 electrically connected to the polysilicon layer 150 via a contact hole 69 provided in the interlayer insulating film 65.

A gate insulating film 60 may be provided between a part of the interlayer insulating film 65, the part being located below the source pad 110, and the well regions 20, the source regions 31 and 32 and the drift layer 12. A gate electrode 125 may be provided on the gate insulating film 60 between the source regions 31 and 32. The gate electrode 125 may be electrically connected to the gate pad 120.

A field insulating film 62 may be provided between the well region 20 and the polysilicon layer 150. The polysilicon layer 150 may extend and lie over the field insulating film 62 to form a stepped part. Additionally, the impurity concentration of the well region 20 in the present embodiment is $5 \times 10^{16}$ to $1 \times 10^{19}$ cm$^{-3}$, for example, and the impurity concentration of the superhigh-concentration p-type region (a well contact region 21 described later) is $2 \times 10^{19}$ to $1 \times 10^{21}$ cm$^{-3}$, for example.

Figure 3:
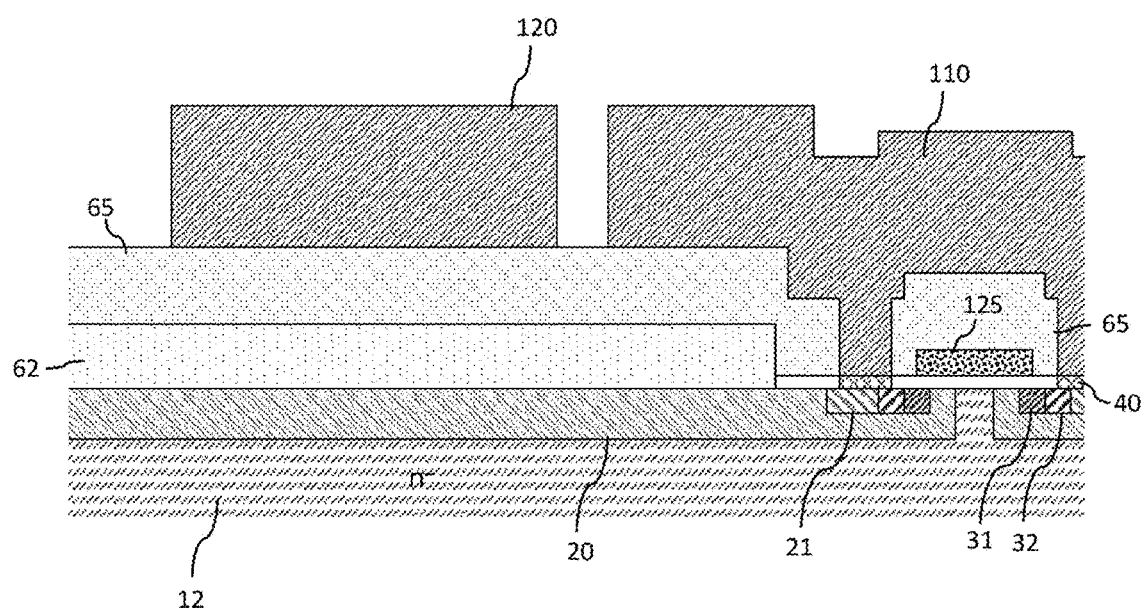
FIG. 3 is a sectional view of the semiconductor device that can be used in the first embodiment of the present invention, and is a sectional view of a part different from a part illustrated in FIG. 1.

The polysilicon layer 150 does not need to be provided in all regions below the gate pad 120. As illustrated in FIG. 3, a region where the polysilicon layer 150 is not provided may exist below the gate pad 120. In that region, the field insulating film 62 may be provided above the well region 20 and the interlayer insulating film 65 may be provided above the field insulating film 62. Further, the polysilicon layer 150 may be provided such that a part thereof located below the gate pad 120 has a slit-like shape extending along a width direction corresponding to a horizontal direction in FIG. 2. Then, as illustrated in FIG. 3, in the part having a slit-like shape in the polysilicon layer 150, the field insulating film 62 may be provided above the well region 20 and the interlayer insulating film 65 may be provided above the field insulating film 62.

The drift layer 12 may be formed on the first main surface of the silicon-carbide semiconductor substrate 11 by a CVD process or the like. The n-type impurity concentration of the drift layer 12 may be lower than the n-type impurity concentration of the silicon-carbide semiconductor substrate 11. Thus, the drift layer 12 may serve as a low-concentration region (n⁻) and the silicon-carbide semiconductor substrate 11 may serve as a region having a higher concentration (n) than the drift layer 12. N, P, and the like can be used as n-type impurities, for example, and Al, B, and the like can be used as p-type impurities, for example. In the present embodiment, the impurity concentration of the drift layer 12 may be $1 \times 10^{14}$ to $4 \times 10^{16}$ cm$^{-3}$, for example, and the impurity concentration of the silicon-carbide semiconductor substrate 11 may be $1 \times 10^{18}$ to $3 \times 10^{19}$ cm$^{-3}$, for example.

The gate pad 120 may be formed of metal such as Al, for example, and the gate electrode 125 may be formed of polysilicon or the like, for example. The interlayer insulating film 65 may be formed on an upper surface of the gate electrode 125 and the like. The gate electrode 125 may be formed using a CVD process, a photolithography technique, or the like, and the interlayer insulating film 65 may be formed using a CVD process or the like, and may be formed of silicon dioxide, for example.

In a case where the gate electrode 125 is formed of polysilicon, the gate electrode 125 and the polysilicon layer 150 may be formed of the same polysilicon. As polysilicon, undoped polysilicon that is doped with no impurity can be used and also doped polysilicon that is doped with n-type or p-type impurities such as phosphor and boron, for example, can be used. The terms "the same polysilicon" in the present embodiment mean that both of polysilicon materials are undoped polysilicon or doped polysilicon, and that the kinds and concentrations of impurities doped into doped polysilicon are the same. The terms do not require both of polysilicon materials to be simultaneously manufactured. Thus, even in a case where the gate electrode 125 is formed of polysilicon and thereafter the polysilicon layer 150 is formed separately, for example, if polysilicon materials used in the gate electrode 125 and the polysilicon layer 150 are of the same kind (undoped polysilicon or doped polysilicon) and the kinds and concentrations of impurities are the same, the gate electrode 125 and the polysilicon layer 150 are regarded as being formed of the same polysilicon.

The gate electrode 125 and the polysilicon layer 150 may be formed of different kinds of polysilicon. For example, the gate electrode 125 may be formed of doped polysilicon and the polysilicon layer 150 may be formed of undoped polysilicon. Further, even in a case where both of the gate electrode 125 and the polysilicon layer 150 are formed of doped polysilicon, n-type doped polysilicon may be used in the gate electrode 125 while p-type doped polysilicon may be used in the polysilicon layer 150. Conversely, p-type doped polysilicon may be used in the gate electrode 125 while n-type doped polysilicon may be used in the polysilicon layer 150. Moreover, even in a case where the conductivity types of impurities used in the gate electrode 125 and the polysilicon layer 150 are the same, that is, an n type or a p type, the concentrations of the impurities may be different. The impurity concentration of doped polysilicon used in the gate electrode 125 may be higher than the impurity concentration of doped polysilicon used in the polysilicon layer 150. Conversely, the impurity concentration of doped polysilicon used in the gate electrode 125 may be lower than the impurity concentration of doped polysilicon used in the polysilicon layer 150.

As illustrated in FIG. 3, in a section where the polysilicon layer 150 is not provided, the field insulating film 62 may be provided on the well region 20, the interlayer insulating film 65 may be provided on the field insulating film 62, and the gate pad 120 may be provided on the interlayer insulating film 65. Alternatively, the polysilicon layer 150 may be provided in all regions below the gate pad 120 and the field insulating film 62 may be absent below the gate pad 120, unlike those in the above-described aspect.

As illustrated in FIG. 2, in the well region 20, a region (hereinafter also referred to as a "well contact region 21") that is adjacent to the source regions 31 and 32 and is electrically connected to a source pad 110 may be formed of a superhigh-concentration p-type region ($p^{++}$). The source regions 31 and 32 may have a high-concentration n-type region ($n^+$) 31 placed on a side closer to the gate electrode 125, and a superhigh-concentration n-type region ($n^{++}$) 32 provided adjacently to the high-concentration n-type region ($n^+$) 31. Then, the well contact region 21 may be provided adjacently to the superhigh-concentration n-type region ($n^{++}$) 32. A metallic layer 40 formed of nickel, titanium, or alloy containing nickel or titanium may be provided between each of the superhigh-concentration n-type region ($n^{++}$) 32 in the source regions 31 and 32 and the well contact region 21, and the source pad 110. Additionally, in the present embodiment, the impurity concentration of the high-concentration n-type region ($n^+$) may be $1 \times 10^{18}$ to $2 \times 10^{19}$ $cm^{-3}$, for example, and the impurity concentration of the superhigh-concentration n-type region ($n^{++}$) may be $2 \times 10^{19}$ to $1 \times 10^{21}$ $cm^{-3}$, for example. Further, the high-concentration n-type region ($n^+$) 31 may be absent and the corresponding region may be substituted by the superhigh-concentration n-type region ($n^{++}$) 32.

Regarding the depth of the well region 20, a bottom surface thereof is positioned at a level higher than a bottom surface of the drift layer 12, and the well region 20 may be provided in the drift layer 12. Further, regarding the depths of the source regions 31 and 32, bottom surfaces thereof are positioned at a level higher than the bottom surface of the well region 20, and the source regions 31 and 32 may be formed in the well region 20. Moreover, regarding the depth of the well contact region 21, a bottom surface thereof may be positioned at a level higher than a bottom surface of the well region 20 except the well contact region 21.

The polysilicon layer 150 and the well region 20 may be in Schottky contact. The superhigh-concentration n-type region ($n^{++}$) 32 in the source regions 31 and 32 may be in ohmic contact with the metallic layer 40 provided below the source pad 110. Further, also the well contact region 21 that is a superhigh-concentration p-type region ($p^{++}$) may be in ohmic contact with the metallic layer 40 provided below the source pad 110.

<<Operation and Effects>>

Next, examples of operation and effect of the present embodiment having the above-described configuration will be described. Note that all aspects described in "Operation and Effects" can be adopted in the above-described configuration.

In the present embodiment, in a case of adopting an aspect in which the polysilicon layer 150 electrically connected to the source pad 110 is provided in a region below the gate pad 120 and the polysilicon layer 150 is in contact with the well region 20, abnormal increase of a potential in the well region 20 in a region below the gate pad 120 can be prevented.

The sheet resistance of polysilicon, or doped polysilicon in particular, is smaller incommensurably than that of the p-type well region 20. For this reason, employing the polysilicon layer 150 according to the present embodiment can suppress increase of a potential in the p-type well region 20 due to the sheet resistance. In view of the foregoing effects, it is advantageous to employ doped polysilicon as the polysilicon layer 150.

When a potential of the p-type well region 20 increases, a Schottky diode formed between the polysilicon layer 150 and the p-type well region 20 is placed in an ON state, so that a current flows in the polysilicon layer 150. In a case where the polysilicon layer 150 and the p-type well region 20 are in Schottky contact, the polysilicon layer 150 operates only at a turn-off time and dV/dt can be prevented from excessively increasing due to resistance of the p-type well region 20 at a turn-on time (at which the p-type well region 20, which is negatively biased, is unlikely to be applied with an excessively strong electric field because the well region 20 located below the gate electrode 125 is placed in a state of depletion).

Further, the resistivity of contact between the source pad 110 and the polysilicon layer 150, or doped polysilicon in particular, is smaller incommensurably than the resistivity of contact between the p-type well contact region 21 and the metallic layer 40. For this reason, it is possible to suppress increase of a potential in the p-type well region 20 due to contact resistance. Moreover, because of a large area of contact between the polysilicon layer 150 and the p-type well region 20, the resistivity of contact presents no problem in principle.

If a Schottky electrode formed of a metallic material is used below an interlayer insulating film 65 below a gate pad 120, the manufacturing process thereof is considerably complicated and manufacturing costs therefor are considerably high. In contrast thereto, providing the polysilicon layer 150 below an interlayer insulating film 65 below a gate pad 120 is advantageous in that the manufacturing process thereof is simplified.

In a case where the gate electrode 125 is formed of polysilicon and the gate electrode 125 and the polysilicon layer 150 are formed of the same polysilicon, the polysilicon layer 150 can be formed simultaneously with formation of the gate electrode 125. This can significantly simplify the manufacturing process thereof. Specifically, the polysilicon layer 150 can be formed at the time of film formation for the gate electrode 125 formed of polysilicon in a cell part including the source regions 31 and 32. This is significantly advantageous in that a manufacturing process similar to an already-existing manufacturing process can be employed.

Additionally, in the present embodiment, the p-type well region 20 and the polysilicon layer 150 are in Schottky contact, thereby forming a semiconductor in a direction electrically opposite to that in an aspect in which the n-type drift layer 12 and the polysilicon layer 150 are in Schottky contact.

Further, as illustrated in FIG. 2, there is adopted an aspect in which the polysilicon layer 150 is provided so as to extend across a distance longer than the width of the gate pad 120. This is advantageous in preventing abnormal increase of a potential in all regions extending along the widths of the well regions 20 located below the gate pad 120.

As one example of a manufacturing process, the following process can be cited.

The gate electrode 125 is formed and thereafter a part of the gate electrode 125, the part being supposed to be located below the gate pad 120, is removed, to form a field opening.

Subsequently, a film of polysilicon is formed in a position that is supposed to be located below the gate pad 120, thereby forming the polysilicon layer 150. On a part of the polysilicon layer 150, the part being located in a cell region, polysilicon forming the polysilicon layer 150 may be further stacked. In order not to leave the stacked polysilicon, the polysilicon layer 150 may be formed on the gate electrode 125 after the gate electrode 125 is beforehand covered with a mask of an oxide film, for example, and then the mask may be removed after patterning. In a case where doped polysilicon is used as the polysilicon layer 150, the polysilicon layer 150 stacked on the gate electrode 125 may be used as it is without being removed. In a case where undoped polysilicon is used as the polysilicon layer 150 and polysilicon is stacked on the gate electrode 125, the polysilicon may be removed by etching. Alternatively, only a part required to make contact with the gate pad 120 may be masked to prevent the polysilicon layer 150 formed of undoped polysilicon from being stacked thereon, and patterning may be performed to expose an upper surface of the gate electrode 125.

The polysilicon layer 150 is formed in the above-described manner, and subsequently the interlayer insulating film 65 is formed. When a gate contact hole is formed in the formed interlayer insulating film 65, a contact hole 69 also is formed in a part of the interlayer insulating film 65, the part being located above the polysilicon layer 150.

Thereafter, a gate pad 120 and a source pad 110 are formed, the gate pad 120 and the gate electrode 125 are electrically connected via the gate contact hole, and the source pad 110 and the polysilicon layer 150 are electrically connected via the contact hole 69.

In the present embodiment, there is adopted an aspect in which the polysilicon layer 150 and the well region 20 are in Schottky contact. To achieve this Schottky contact, the impurity concentration of the well region 20 may be set to be so low that the well region 20 serves as a low-concentration p-type region (p⁻), for example. Alternatively, the impurity concentration of the polysilicon layer 150 may be set to be low and lightly-doped polysilicon may be employed. Additionally, the impurity concentration of the low-concentration p-type region (p⁻) in the present embodiment is $5\times10^{16}$ to $1\times10^{19}$ cm$^{-3}$, for example.

Second Embodiment

Next, a second embodiment of the present invention will be described.

Figure 4:
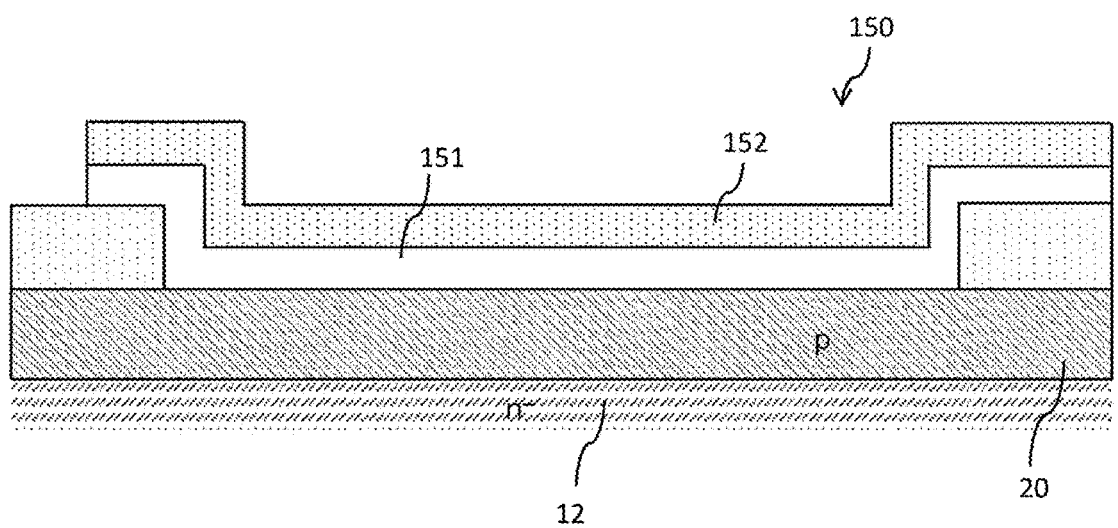
FIG. 4 is a sectional view of a semiconductor device that can be used in a second embodiment of the present invention.

In the present embodiment, as illustrated in FIG. 4, a polysilicon layer 150 has an undoped polysilicon layer 151 provided on a well region 20 so as to be in contact with the well region 20, and a doped polysilicon layer 152 provided on the undoped polysilicon layer 151. Various configurations employed in the above-described embodiment can be employed also in the third embodiment. The members described in the above embodiment will be described with the same reference signs.

In a case where doped polysilicon is used as the polysilicon layer 150, particularly in a case where n-type doped polysilicon is used, a Schottky barrier φB is reduced excessively in some cases. In this regard, in the present embodiment, providing the undoped polysilicon layer 151 as a layer in contact with the well region 20 can prevent excessive reduction of a Schottky barrier φB.

In the present embodiment, it can be considered to employ the following manufacturing method, for example.

A gate electrode 125 is formed and thereafter a part of the gate electrode 125, the part being supposed to be located below a gate pad 120, is removed, to form a field opening.

Subsequently, the undoped polysilicon layer 151 is formed in a position that is supposed to be located below the gate pad 120. Then, the doped polysilicon layer 152 is formed on the undoped polysilicon layer 151. At that time, on the gate electrode 125, while the undoped polysilicon layer 151 and the doped polysilicon layer 152 that form the polysilicon layer 150 may be formed sequentially, a part of the undoped polysilicon layer 151, the part having been formed on the gate electrode 125, may be removed by etching or the like to reduce influences of the undoped polysilicon layer 151. Alternatively, in the gate electrode 125, only a region in contact with the gate pad 120 may be processed so that the undoped polysilicon layer 151 is not formed there. For example, in the gate electrode 125, the undoped polysilicon layer 151 may be removed only in a region in contact with the gate pad 120.

Moreover, an undoped polysilicon layer having a thickness equal to a total thickness of the undoped polysilicon layer 151 and the doped polysilicon layer 152 may be formed. Then, only a part corresponding to the doped polysilicon layer 152 may be doped by ion implantation, for example.

After the polysilicon layer 150 is formed in the above-described manner, an interlayer insulating film 65 is formed. When a gate contact hole is formed in the formed interlayer insulating film 65, a contact hole 69 also is formed in a part of the interlayer insulating film 65, the part being located above the polysilicon layer 150.

Thereafter, the gate pad 120 and a source pad 110 are formed, the gate pad 120 and the gate electrode 125 are electrically connected via the gate contact hole, and the source pad 110 and the doped polysilicon layer 152 of the polysilicon layer 150 come into contact via the contact hole 69.

Third Embodiment

Next, a third embodiment of the present invention will be described.

Figure 5:
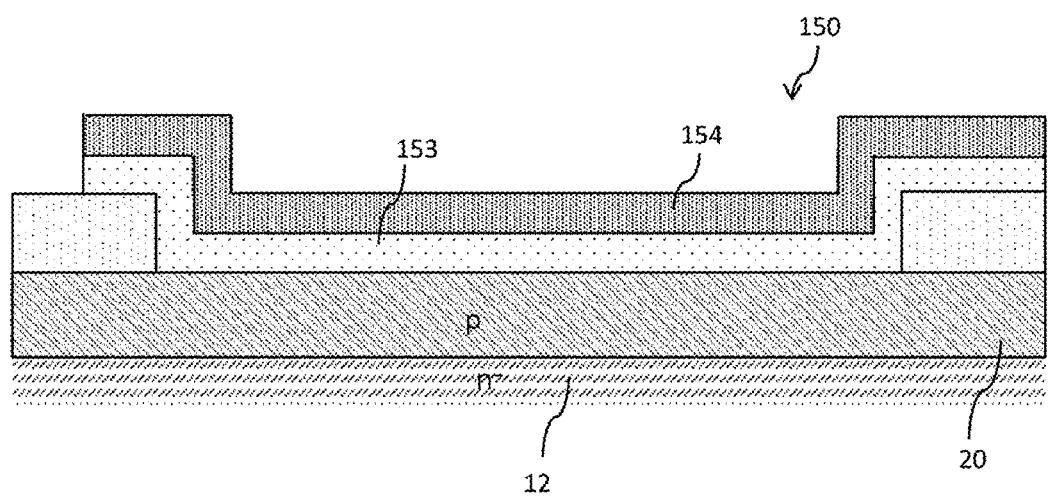
FIG. 5 is a sectional view of a semiconductor device that can be used in a third embodiment of the present invention.

In the present embodiment, as illustrated in FIG. 5, a polysilicon layer 150 has a lightly-doped polysilicon layer 153 in contact with a drift layer 12, and a heavily-doped polysilicon layer 154 that is provided on the lightly-doped polysilicon layer 153 and has an impurity concentration higher than an impurity concentration of the lightly-doped polysilicon layer 153. Various configurations employed in the above-described embodiments can be employed also in the present embodiment. The members described in the above embodiments will be described with the same reference signs. Additionally, the impurity concentration of the lightly-doped polysilicon layer 153 is $1\times10^{15}$ to $5\times10^{18}$ cm$^{-3}$, for example, and the impurity concentration of the heavily-doped polysilicon layer 154 is $5\times10^{18}$ to $1\times10^{21}$ cm$^{-3}$, for example.

Also the present embodiment can produce effects similar to those produced by the second embodiment. By providing the lightly-doped polysilicon layer 153 as a layer in contact with a well region 20, it is possible to prevent excessive reduction of a Schottky barrier φB.

In the present embodiment, it can be considered to employ the following manufacturing method, for example.

A gate electrode 125 is formed and thereafter a part of the gate electrode 125, the part being supposed to be located below a gate pad 120, is removed, to form a field opening.

Subsequently, the lightly-doped polysilicon layer 153 is formed in a position that is supposed to be located below the gate pad 120. Then, the heavily-doped polysilicon layer 154 is formed on the lightly-doped polysilicon layer 153. At that time, on the gate electrode 125, while the lightly-doped polysilicon layer 153 and the heavily-doped polysilicon layer 154 that form the polysilicon layer 150 may be formed sequentially, a part of the lightly-doped polysilicon layer 153, the part having been formed on the gate electrode 125, may be removed by etching or the like to reduce influences of the lightly-doped polysilicon layer 153. Alternatively, in the gate electrode 125, only a region in contact with the gate pad 120 may be processed so that the lightly-doped polysilicon layer 153 is not formed there. For example, in the gate electrode 125, the lightly-doped polysilicon layer 153 may be removed only in a region in contact with the gate pad 120.

Moreover, an undoped polysilicon layer having a thickness equal to a total thickness of the lightly-doped polysilicon layer 153 and the heavily-doped polysilicon layer 154 may be formed. Then, only a part corresponding to the heavily-doped polysilicon layer 154 may be doped by ion implantation, for example.

After the polysilicon layer 150 is formed in the above-described manner, an interlayer insulating film 65 is formed. When a gate contact hole is formed in the formed interlayer insulating film 65, a contact hole 69 also is formed in a part of the interlayer insulating film 65, the part being located above the polysilicon layer 150.

Thereafter, the gate pad 120 and a source pad 110 are formed, the gate pad 120 and the gate electrode 125 are electrically connected via the gate contact hole, and the source pad 110 and the heavily-doped polysilicon layer 154 of the polysilicon layer 150 come into contact via the contact hole 69.

Fourth Embodiment

Next, a fourth embodiment of the present invention will be described.

In the present embodiment, there is adopted an aspect in which a polysilicon layer 150 and a well region 20 are in ohmic contact. In the other respects, the present embodiment is similar to the above-described embodiments, and various configurations employed in the above-described embodiments can be employed also in the present embodiment. The members described in the above-described embodiments will be described with the same reference signs.

The present embodiment also can prevent abnormal increase of a potential in the well region 20 in a region below a gate pad 120.

The sheet resistance of polysilicon, or doped polysilicon in particular, is smaller incommensurably than that of the p-type well region 20. For this reason, employing the polysilicon layer 150 according to the present embodiment can suppress increase of a potential in the p-type well region 20 due to the sheet resistance. Further, also in the present embodiment, increase of a potential in the p-type well region 20 allows a current to flow in the polysilicon layer 150.

In order to achieve ohmic contact in the present embodiment, the impurity concentration of the well region 20 may be set to be so high that the well region 20 serves as a high-concentration p-type region ($p^+$), for example. Alternatively, the impurity concentration of the polysilicon layer 150 may be set to be high and heavily-doped polysilicon may be employed. Additionally, the impurity concentration of the high-concentration p-type region ($p^+$) in the present embodiment is $2\times10^{19}$ to $1\times10^{21}$ $cm^{-3}$, for example.

As described above, the aspects in the above-described embodiments can be adopted in the present embodiment. Thus, in the same manner as in the second embodiment, the polysilicon layer 150 may have an undoped polysilicon layer 151 and a doped polysilicon layer 152, and the undoped polysilicon layer 151 and the p-type well region 20 may be in ohmic contact. Alternatively, in the same manner as in the third embodiment, the polysilicon layer 150 may have a lightly-doped polysilicon layer 153 and a heavily-doped polysilicon layer 154, and the lightly-doped polysilicon layer 153 and the p-type well region 20 may be in ohmic contact.

Additionally, in the first to third embodiments, the description has been given using the aspect in which the polysilicon layer 150 and the well region 20 are in Schottky contact, and in the present embodiment, the description has been given using the aspect in which the polysilicon layer 150 and the well region 20 are in ohmic contact. However, the present invention is not limited to those. The polysilicon layer 150 and the well region 20 may be intermediate in characteristics between Schottky contact and ohmic contact.

Moreover, use of heavily-doped polysilicon as the polysilicon layer 150 in contact with the well region 20 is more advantageous in preventing increase of the sheet resistance, as compared to a case where lightly-doped polysilicon is used.

The foregoing descriptions of the embodiments and the disclosure of the drawings are merely one example for describing the present invention recited in the claims. The present invention recited in the claims shall not be limited by the foregoing descriptions of the embodiments and the disclosure of the drawings. Further, the recitations of the claims at the time of the filing of the present application are merely an example, and the recitations of the claims can be changed as appropriate based on the description of the specification, the drawings, and the like.

REFERENCE SIGNS LIST 12 drift layer
20 well region
62 field insulating film
65 interlayer insulate
110 source pad
120 gate pad
150 polysilicon layer
151 undoped polysilicon layer
152 doped polysilicon layer
153 lightly-doped polysilicon layer
154 heavily-doped polysilicon layer

The invention claimed is:
1. A wide gap semiconductor device comprising:
a drift layer using a first conductivity type wide gap semiconductor material;
a well region, being a second conductivity type and provided in the drift layer;
a polysilicon layer provided on the well region;

a field insulating film provided between the well region and the polysilicon layer;

an interlayer insulating film provided above the polysilicon layer;

a gate pad provided above the interlayer insulating film; and a source pad electrically connected to the polysilicon layer at a stepped part which lies over the field insulating film, wherein the interlayer insulating film is sandwiched between the polysilicon layer and the gate pad and wherein the interlayer insulating film is configured to contact both the polysilicon layer and the gate pad.

2. The wide gap semiconductor device according to claim 1, wherein the polysilicon layer and the well region are in Schottky contact.

3. The wide gap semiconductor device according to claim 1, wherein the polysilicon layer and the well region are in ohmic contact.

4. A wide gap semiconductor device comprising:

a drift layer using a first conductivity type wide gap semiconductor material;

a well region, being a second conductivity type and provided in the drift layer;

a polysilicon layer provided on the well region;

an interlayer insulating film provided above the polysilicon layer;

a gate pad provided above the interlayer insulating film; and a source pad electrically connected to the polysilicon layer, wherein the polysilicon layer has a lightly-doped polysilicon layer provided on the well region, and a heavily-doped polysilicon layer, which is provided on the lightly-doped polysilicon layer and has an impurity concentration higher than an impurity concentration of the lightly-doped polysilicon layer.

5. A wide gap semiconductor device comprising:

a drift layer using a first conductivity type wide gap semiconductor material;

a well region, being a second conductivity type and provided in the drift layer;

a polysilicon layer provided on the well region;

an interlayer insulating film provided above the polysilicon layer;

a gate pad provided above the interlayer insulating film; and a source pad electrically connected to the polysilicon layer, wherein the polysilicon layer has an undoped polysilicon layer provided on the well region, and a doped polysilicon layer provided on the undoped polysilicon layer.

6. The wide gap semiconductor device, according to claim 1, further comprising a gate electrode formed of polysilicon, which constitutes the polysilicon layer.

7. The wide gap semiconductor device according to claim 1, wherein a source region is provided in the well region, a region, which is adjacent to the source region and is electrically connected to the source pad, in the well region is a superhigh-concentration second conductivity type region.

* * * * *